United States Patent [19]

Davis et al.

[11] 4,326,251
[45] Apr. 20, 1982

[54] MONITORING SYSTEM FOR A DIGITAL DATA PROCESSOR

[75] Inventors: Sheila G. Davis, Los Angeles; Robert E. Franks, San Gabriel, both of Calif.; Alfred J. De Santis, Berwyn, Pa.

[73] Assignee: Burroughs Corporation, Detroit, Mich.

[21] Appl. No.: 85,277

[22] Filed: Oct. 16, 1979

[51] Int. Cl.³ .............................................. G06F 13/06
[52] U.S. Cl. .................................................... 364/200
[58] Field of Search ... 364/200 MS File, 900 MS File; 371/16, 25, 26, 21, ; 324/73 R, 73 AC, 73 PC; 365/201

[56] References Cited
U.S. PATENT DOCUMENTS

| | | | |
|---|---|---|---|
| 3,374,467 | 3/1968 | Cast et al. | 364/900 |
| 3,553,654 | 1/1971 | Crane | 364/200 |
| 3,579,199 | 5/1971 | Anderson | 364/200 |
| 3,719,929 | 3/1973 | Fay et al. | 364/200 |
| 3,742,456 | 6/1973 | McFiggans | 364/200 |
| 3,913,072 | 10/1975 | Catt | 364/900 |
| 3,921,141 | 9/1975 | Wilber et al. | 364/200 |
| 4,024,509 | 5/1977 | Elmer | 364/900 |
| 4,099,229 | 7/1978 | Kancier | 364/200 |
| 4,128,873 | 12/1978 | Lamiaux | 364/200 |

OTHER PUBLICATIONS

Dimitri, "Delay Testing & Diagnosis of LSSD Shift Register Strings" IBMTDB vol. 20, No. 1, 6/77, pp. 307-312.

*Primary Examiner*—Harvey E. Springborn
*Attorney, Agent, or Firm*—Nathan Cass; Kevin R. Peterson; David G. Rasmussen

[57] ABSTRACT

Internal states of storage devices within a digital data processing system are made accessible using variable mode multi-bit shift register storage devices. The inputs and outputs of these shift register storage devices are interconnected by gating means which may be selectably controlled to form separately selectable serial strings along which the bits of a selected string may be caused to be shifted to a monitoring unit for monitoring, diagnosing and/or correcting purposes and then returned, via the string, to their original locations in the shift register storage devices, after which normal data processing operations can be resumed, or other appropriate action taken.

7 Claims, 4 Drawing Figures

MONITORING SYSTEM FOR A DIGITAL DATA PROCESSOR

CROSS REFERENCE TO RELATED PATENT APPLICATIONS

This patent application contains subject matter relating to our commonly assigned copending patent applications Ser. No. 85,200, Ser. No. 85,278 and Ser. No. 85,388, all filed concurrently herewith on Oct. 16, 1979.

BACKGROUND OF THE INVENTION

This invention relates generally to data processing systems, and more particularly to improved means and methods for providing for the monitoring and diagnosing of digital circuit operations with minimum burden on the data processing system.

SUMMARY OF THE INVENTION

In a particular preferred form of the invention, internal states within a data processing system are made accessible by providing serial monitoring paths or "strings" between particular internal logical storing devices which have the capability of operating in either a normal or monitoring mode. When it is desired to monitor the state of one or more of the storing devices on a selected string, the normal operation is interrupted and the storing devices on the selected string are then switched to their monitoring mode. Clocking is then controlled so that the internal states of the internal storing devices on the selected string are propagated, via the string, to a monitoring unit and then returned, again via the string, so that the internal storing devices on the selected string are returned to their original states, following which normal operation may resume. In the event an error is detected by the monitoring unit with respect to the state of one or more internal storing devices on the selected string, an appropriate indication of the error is provided and also, if desired, corrected states may be provided for substitution in the corresponding internal storing devices.

The specific nature of the invention as well as other objects, features, advantages and uses thereof will become readily apparent from the following detailed description taken in conjunction with the accompanying drawings.

DETAILED DESCRIPTION

Like characters and numerals refer to like elements and components throughout the figures of the drawings.

Figure 1:
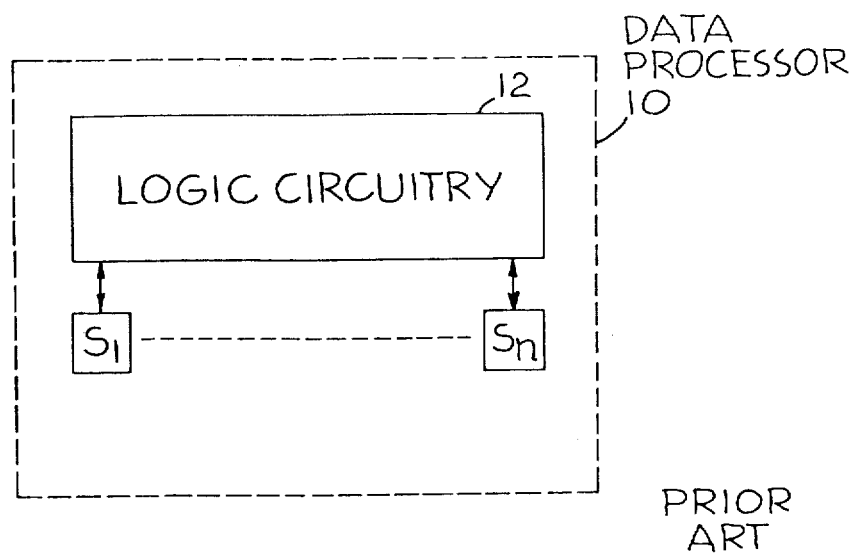
FIG. 1 is a generalized block diagram illustrating how storage devices are typically interconnected by logic circuitry in a conventional data processor.

Referring initially to FIG. 1, a conventional form of data processor 10 is illustrated typically including a plurality of storage devices $S_1$-$S_n$ cooperating with logic circuitry 12 in providing data processing operations. Other conventional portions of a data processor (such as a memory) are not shown in FIG. 1 for the sake of simplicity and because these are not pertinent to the present invention, but such portions may be considered to operate in cooperation with the storage devices $S_1$-$S_n$ and logic circuitry 12 in a conventional manner. A primary purpose of the present invention is to provide improved means and methods for making accessible the internal states of data processor storage devices, such as illustrated by devices $S_1$-$S_n$ in FIG. 1, for monitoring diagnostic and/or correcting purposes with minimum burden on the data processing system. In the preferred embodiment of the present invention disclosed herein, it is of particular advantage to employ variable mode, multi-bit shift register storage devices such as illustrated by the variable mode, 4-bit shift register 15 illustrated in FIG. 2. Such a shift register 15 may be implemented, for example, using a commercially available Texas Instruments 74S194 integrated circuit chip.

Figure 2:
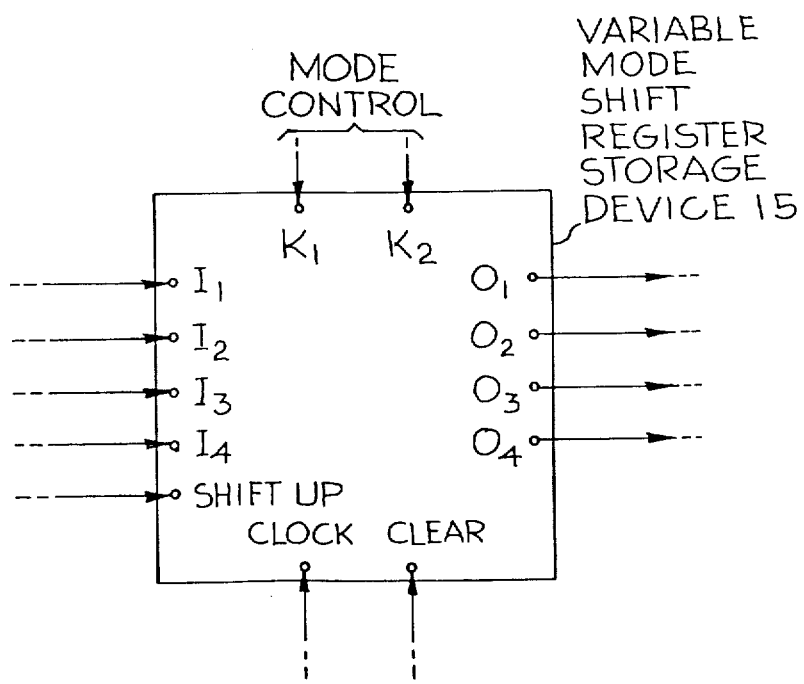
FIG. 2 is a block representation of a variable mode shift register storage device which is preferably employed for providing digital storage in a data processing system incorporating the invention.

As shown in FIG. 2, the 4-bit variable mode shift register 15 includes: inputs $I_1$, $I_2$, $I_3$ and $I_4$; respective outputs $O_1$, $O_2$, $O_3$ and $O_4$; a "Shift-Up" input for receiving input signals to be shifted through the register; a clear input for use in clearing the shift register to all "0" values; a clock input for receiving a clock signal whose leading edge, for example, is used to initiate shift register operations; and mode control inputs $K_1$ and $K_2$ to which mode control signals are applied for determining the particular mode in which the shift register is to operate. Typically, the mode control signals applied to inputs $K_1$ and $K_2$ may have the following meanings: $K_1K_2 = 00 =$ No Change; $K_1K_2 = 11 =$ Parallel Load; and $K_1K_2 = 01 =$ Shift Up.

It will be understood that when $K_1K_2 = 11 =$ Parallel Load, input binary signals are loaded in parallel into respective inputs $I_1$-$I_4$ of shift register 15 in response to the leading edge of an applied clock. When so loaded the respective binary values thereof appear at respective outputs $O_1$-$O_4$. Accordingly, in the Parallel Load mode ($K_1K_2 = 11$) shift register 15 in FIG. 2 functions as four independent clock-controlled storage devices (similar to flip-flops or latches) having respective inputs $I_1$, $I_2$, $I_3$ and $I_4$ and respective outputs $O_1$, $O_2$, $O_3$ and $O_4$ connected to logic circuitry 12 in FIG. 1 in a customary manner. In the No Change mode ($K_1K_2 = 00$), the shift register values remain unchanged regardless of the binary signals applied to inputs $I_1$-$I_4$. In the Shift Up mode ($K_1K_2 = 01$), serial shifting occurs upwardly in response to each clock—that is, from the Shift Up input to $I_4$, from $I_4$ to $I_3$, from $I_3$ to $I_2$ and from $I_2$ to $I_1$; and correspondingly from $O_4$ to $O_3$, from $O_3$ to $O_2$ and from $O_2$ to $O_1$. The Parallel Load and No Change modes are used during normal data processing operations, while the Shift Up mode is used during monitoring operations as will hereinafter be described in further detail.

Figure 3:
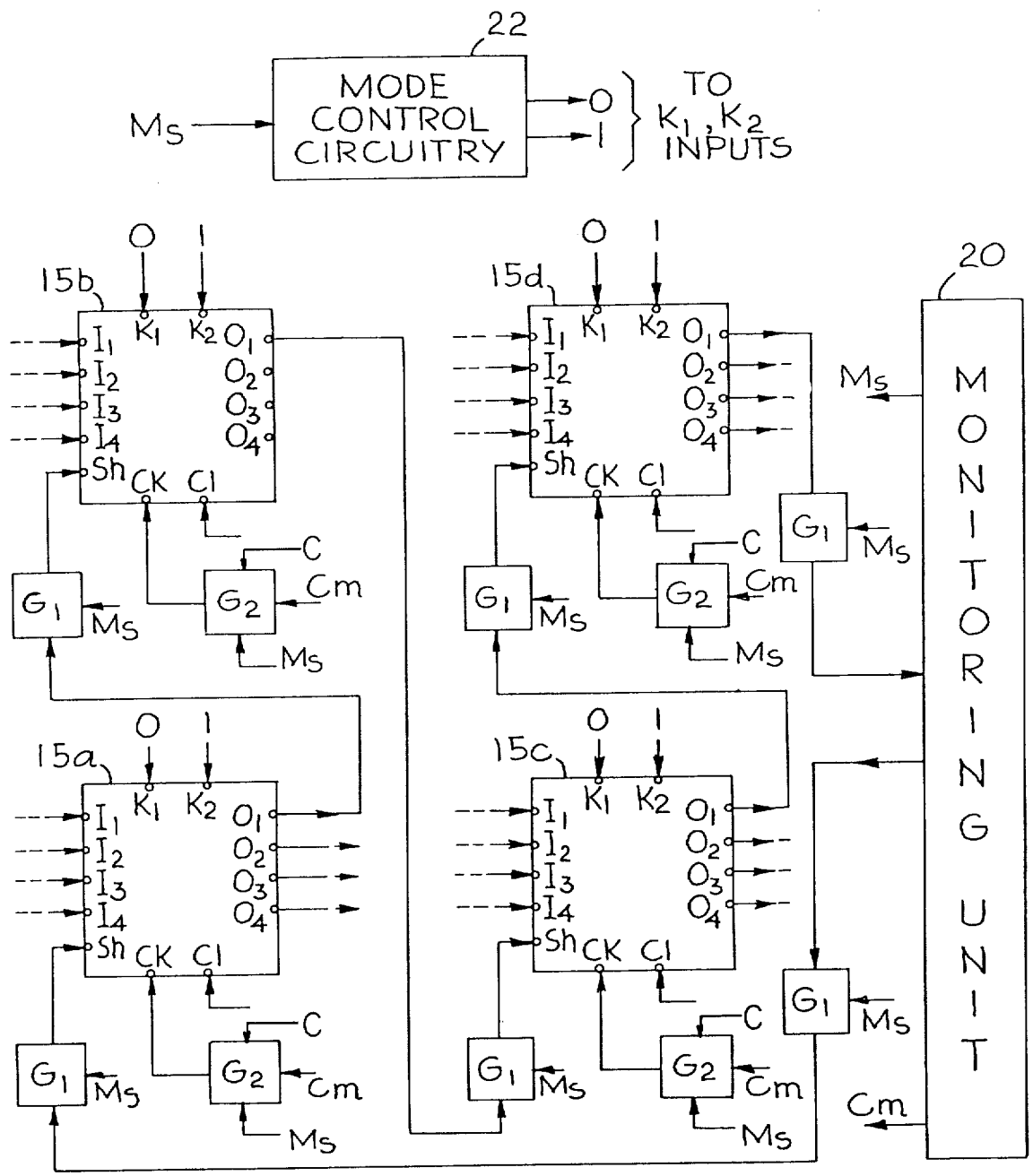
FIG. 3 is a block diagram illustrating how the variable mode shift register storage devices of FIG. 2 may be interconnected in accordance with the invention to form a String for cooperation with a monitoring unit.

FIG. 3 illustrates a preferred manner in accordance with the invention for interconnecting variable mode shift register storage devices, such as illustrated in FIG. 2, into a "String" for cooperation with a monitoring unit 20. Although FIG. 3 illustrates only a single String comprised of four 4-bit variable mode shift register devices 15a-15d, it will be understood that many such Strings are ordinarily provided in a data processor, and that more or less shift register storage devices may be provided in each String.

Now considering FIG. 3 in more detail, it will be understood that variable mode storage devices 15a–15d are interconnected by gating circuitry $G_1$ so as to form a String when the gating circuitry $G_1$ is enabled by a monitor enable signal $M_s$ provided by a monitoring unit 20. The monitor enable signal $M_2$ is also used to cause mode control circuitry 22 to provide Shift Up mode control signals ($K_1K_2=01$) to the mode control inputs $K_1K_2$ of shift register storage devices 15a–15d, thereby causing serial feeding of the respective sixteen states of the four 4-bit shift register storage devices 15a–15d to the monitoring unit 20 and then back again to their respective shift register storage devices 15a–15d under the control of a monitor clock $C_m$ provided by the monitoring unit 20. The monitor clock $C_m$ is applied to the clock input of each of shift register devices 15a–15d via clock gate circuitry $G_2$ which in response to monitoring control signal $M_s$ disconnects the normally provided processor clock C while permitting the monitoring clock $C_m$ to be applied therethrough to the clock inputs of the shift register storage devices of the String. Since the four shift register devices 15a–15d in FIG. 3 form a 16-bit String, it will be understood that a total of 20 monitoring clocks $C_m$ are required to feed the sixteen states of the four shift register devices 15a–15d to the monitoring unit 20 for monitoring diagnostic and/or corrective purposes and then back again so that the shift register devices are returned to their original states or to corrected states, after which normal operations may be resumed. It will be evident from FIG. 3 that the String comprises the 16 bits constituted by the shift register outputs $O_{1a}, O_{2a}, O_{3a}, O_{4a}, O_{1b}, O_{2b}, O_{3b}, O_{4b}, O_{1c}, O_{2c}, O_{3c}, O_{4c}, O_{1d}, O_{2d}, O_{3d}, O_{4d}$, wherein the a, b, c and d subscripts identify the respective one of shift registers 15a, 15b, 15c and 15d to which the outputs $O_1, O_2, O_3$ and $O_4$ correspond.

Figure 4:
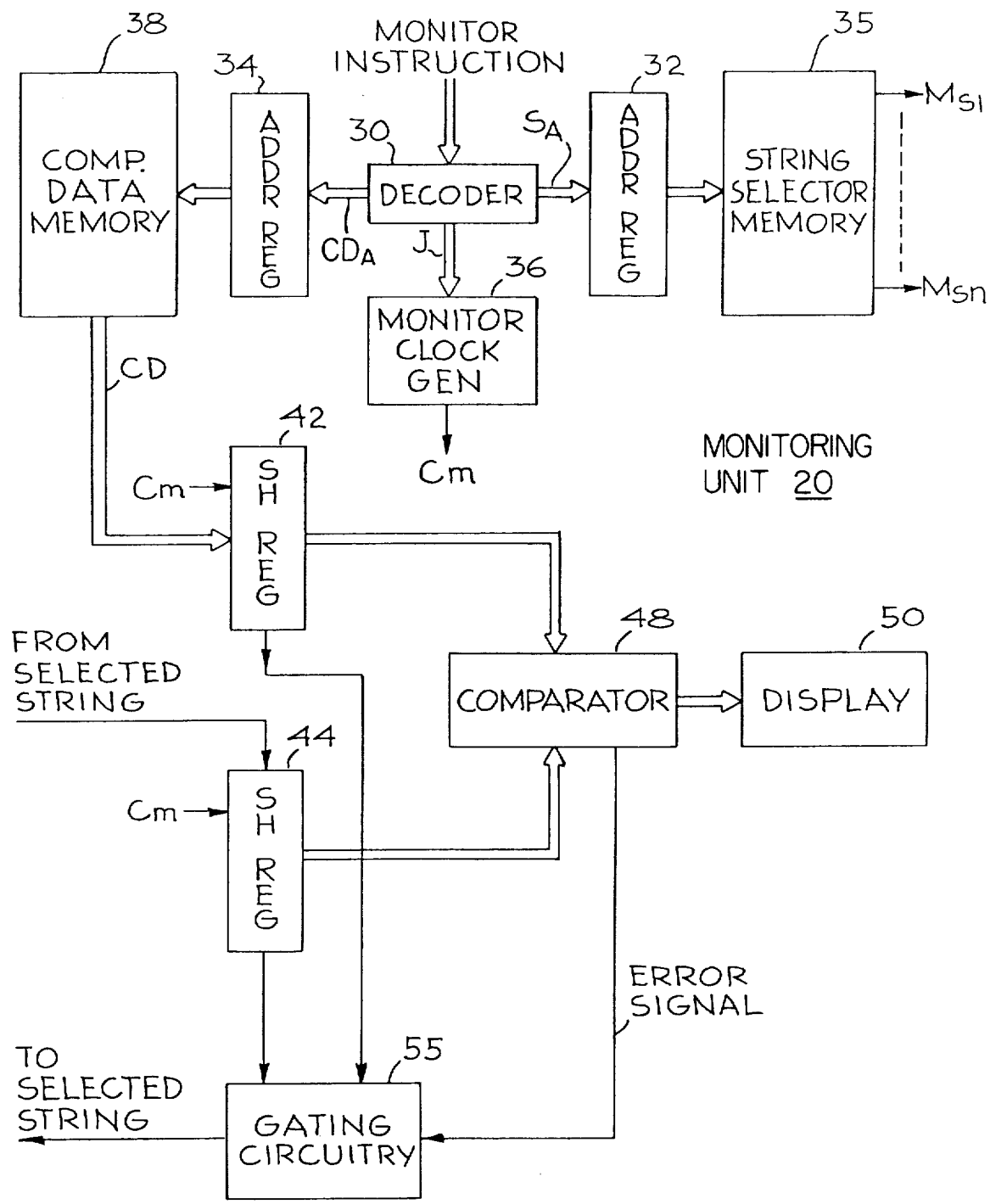
FIG. 4 is a block diagram illustrating an example of a monitoring unit which may be employed in accordance with the invention.

Reference is now directed to FIG. 4 which illustrates one type of monitoring unit 20 which may be employed. As indicated in FIG. 4, the operation of the monitoring unit 20 is initiated by a Monitor Instruction applied to a decoder 30 which derives therefrom a String address $S_A$ and a comparison data address $CD_A$ which are supplied to address registers 32 and 34, respectively.

The String address $S_A$ applied to address register 32 in FIG. 4 selects from a String selector memory 35 a particular one of monitor enable signals $M_{s1}$–$M_{sn}$ for enabling the gating circuitry $G_1$ and $G_2$ of a selected String for feeding the shift register states of the shift register storage devices making up the selected String to the monitoring unit 20 and back again as described previously in connection with FIG. 3.

The decoder 30 also applies a count signal J to a monitor clock generator 36 for producing a predetermined number of monitor clocks which is determined by the number of bits in the selected String.

Still with reference to FIG. 4, the comparison data address $CD_A$ applied to address register 34 selects from a comparison data memory 38 a particular comparison data word CD having values corresponding to the states of the shift register storage devices of the selected String, the selected comparison data word being applied to a shift register storage device 42 which may be of conventional form. Since the four 4-bit shift register storage devices provide a total of sixteen bits to be monitored, the corresponding comparison data word will likewise have sixteen bits and the shift register storage device 42 will accordingly be adapted to store at least sixteen bits. The bits of the selected String (provided as illustrated in FIG. 3) are serially loaded into a shift register storage device 44 which may also be of conventional form, and likewise is adapted to accommodate the sixteen bits fed thereto by the shift register storage devices of the selected String under the control of the monitor clock $C_m$.

The timing of the loading of the shift register devices 42 and 44 is chosen so that the sixteen bits of the selected String and the corresponding comparison data word are simultaneously stored in shift register storage devices 42 and 44, respectively, at which time they are then compared by a comparator 48 and the results of the comparison indicated by a display 50 or other appropriate device. Meanwhile, the sixteen bits from the selected String continue to be shifted under the control of monitor clock $C_m$ and after a total of 16 clocks are returned via gating circuitry 55 back to their respective shift register devices 15a–15d in FIG. 3. In the event the comparator 48 detects an error between one or more bits of the selected String and the corresponding comparison data word, the comparator 48 provides an appropriate signal to gating circuitry 55 which causes the bits of the comparison data word (or any desired number of bits thereof) in shift register storage device 42 to be shifted to the shift register storage devices of the selected String instead of those in shift register storage device 44.

Although the description herein has primarily been considered with particular embodiments and examples of the invention, it is to be understood that the invention is subject to a wide variety of possible modifications and variations without departing from the true scope thereof. Accordingly, the present invention should be considered as encompassing all possible modifications, variations and alternative implementations coming within the broad scope of the invention as defined by the appended claims.

What is claimed is:

1. In a digital data processing system, the combination comprising:

a plurality of storage devices providing for digital storage in said system, each storage device providing for the storage of a plurality of bits which can be inputted or outputted in series or in parallel;

logic circuitry interconnecting said storage devices for the performance of parallel data processing operations by said system;

said logic circuitry also including selectably controllable means for interconnecting said storage devices so as to form a plurality of separately selectable strings, wherein each string comprises at least two serially connected storage devices; and monitoring means for performing monitoring of digital data applied thereto from a selected string;

said monitoring means including means for selectably generating one of a plurality of monitor enable signals and for also selectively generating a predetermined plurality of monitor clock signals which are applied to said selectably controllable means and to the storage devices of a selected string corresponding to the applied monitor enable signal so as to cause the bits stored therein to be serially propagated to and from said monitoring means with the bits of the storage devices of the selected string being returned to states determined by said monitoring means.

2. The invention in accordance with claim 1, wherein the particular predetermined plurality of monitor clock signals generated by said monitoring means is determined by the total number of bits contained in the storage devices of the selected string.

3. The invention in accordance with claim 1, wherein said monitoring means includes means for changing as well as monitoring the bits of the selected string applied thereto.

4. The invention in accordance with claim 3, wherein said monitoring means includes means for determining whether the bits of the applied string are correct and if not for returning corrected bits to said storage devices.

5. The invention in accordance with claim 1, 2, 3 or 4, wherein each of said storage devices is a variable mode register having normal and shift operational modes, and wherein said selectably controllable means is responsive to a monitor enable signal to cause a predetermined plurality of storage devices corresponding to the applied monitor enable signal to be placed in a shift mode and to be interconnected so as to form a serial string coupled to said monitoring means and along which string the bits constituting the states of the storage devices in the string are shifted in response to said monitor clock signals.

6. The invention in accordance with claim 1, 2, 3 or 4, wherein said storage devices are provided using a plurality of variable mode shift register storage devices, each shift register storage device having a clock signal input, a plurality of inputs for receiving digital data to be stored in response to an applied clock signal, a corresponding plurality of outputs providing for the outputting of the stored digital data, a shift input for receiving digital data for serial shifting through the shift register storage device in response to applied clock signals, and at least one mode control input for receiving mode control data from said selectably controllable means for determining whether the shift register storage device is to operate in a normal mode in which it serves to provide (digital storage) parallel input and output for said data processing system or is to operate in a shift mode in which data applied to its shift input is serially shifted therethrough.

7. The invention in accordance with claim 6, wherein said selectably controllable means is responsive to a monitor enable signal to cause a predetermined plurality of said variable mode shift register storage devices corresponding to the applied monitor enable signal to be placed in said shift mode and to be interconnected so as to form a serial string coupled to said monitoring means and along which string the bits constituting the states of the stored data are shifted in response to applied monitor clock signals.

* * * * *

UNITED STATES PATENT AND TRADEMARK OFFICE
CERTIFICATE OF CORRECTION

PATENT NO. : 4,326,251
DATED : April 20, 1982
INVENTOR(S) : Sheila G. Davis, et al.

It is certified that error appears in the above—identified patent and that said Letters Patent is hereby corrected as shown below:

Col. 3, line 8, change "$M_2$" to --$M_s$--.

Col. 6, line 13, delete "(digital storage)"

Signed and Sealed this

Fifteenth Day of June 1982

[SEAL]

Attest:

GERALD J. MOSSINGHOFF

Attesting Officer     Commissioner of Patents and Trademarks

UNITED STATES PATENT AND TRADEMARK OFFICE
CERTIFICATE OF CORRECTION

PATENT NO. : 4,326,251
DATED : April 20, 1982
INVENTOR(S) : Sheila G. Davis et al.

It is certified that error appears in the above-identified patent and that said Letters Patent is hereby corrected as shown below:

The term of this patent subsequent to March 30, 1999, has been disclaimed.

Signed and Sealed this

Sixth Day of September 1983

[SEAL]

Attest:

GERALD J. MOSSINGHOFF

Attesting Officer       Commissioner of Patents and Trademarks